(12) United States Patent
Chiang et al.

(10) Patent No.: US 10,193,251 B2
(45) Date of Patent: Jan. 29, 2019

(54) NEXT GENERATION FORM FACTOR (NGFF) CARRIER

(71) Applicant: HEWLETT PACKARD ENTERPRISE DEVELOPMENT LP, Houston, TX (US)

(72) Inventors: Chin-Lung Chiang, Taipei (TW); Jyun-Jie Wang, Taipei (TW); Andrew Potter, Houston, TX (US); Raghavan V Venugopal, Spring, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/327,727

(22) PCT Filed: Jul. 31, 2014

(86) PCT No.: PCT/US2014/049069
§ 371 (c)(1),
(2) Date: Jan. 20, 2017

(87) PCT Pub. No.: WO2016/018345
PCT Pub. Date: Feb. 4, 2016

(65) Prior Publication Data
US 2017/0214159 A1    Jul. 27, 2017

(51) Int. Cl.
*H01R 13/50* (2006.01)
*H01R 13/62* (2006.01)
(Continued)

(52) U.S. Cl.
CPC .............. *H01R 12/71* (2013.01); *G06F 1/18* (2013.01); *G06F 1/183* (2013.01); *G06F 1/185* (2013.01);
(Continued)

(58) Field of Classification Search
CPC .... H01R 12/71; H01R 12/73; H01R 12/7005; H01R 13/50; G06F 12/0833; G06F 1/18
(Continued)

(56) References Cited

U.S. PATENT DOCUMENTS 4,941,841 A * 7/1990 Darden ................... G06F 1/184
                                                      361/679.39
4,975,805 A   12/1990 Schmutzler
(Continued)

FOREIGN PATENT DOCUMENTS

CN            102141658            8/2011

OTHER PUBLICATIONS

PCT/ISA/KR, International Search Report dated Apr. 24, 2015, PCT/US2014/049069, 10 pps.
(Continued)

*Primary Examiner* — Michael A Lyons
*Assistant Examiner* — Milagros Jeancharles
(74) *Attorney, Agent, or Firm* — Brooks, Cameron & Huebsch, PLLC

(57) ABSTRACT

A Next Generation Form Factor (NGFF) carrier includes a flat component perpendicularly connected to two flat side components to receive an NGFF module, a bar rotatably connected to the two flat side components, and a number of holds along an interior of the flat component to receive a fastener. The NGFF module is insertable in relation to the flat component when the bar is rotated to a first position and fixed on the flat component when the bar is rotated to a second position.

10 Claims, 4 Drawing Sheets

(51) Int. Cl.
  *H01R 12/71* (2011.01)
  *H05K 7/14* (2006.01)
  *G06F 1/18* (2006.01)
  *H01R 12/70* (2011.01)

(52) U.S. Cl.
  CPC .......... *G06F 1/187* (2013.01); *H01R 12/7005* (2013.01); *H01R 13/50* (2013.01); *H05K 7/1487* (2013.01)

(58) Field of Classification Search
  USPC .. 439/64, 61, 59, 607.2–607.33, 374, 928.1, 439/638, 152, 159, 260, 310, 66
  See application file for complete search history.

(56) References Cited

U.S. PATENT DOCUMENTS

| | | | | |
|---|---|---|---|---|
| 5,641,296 | A * | 6/1997 | Larabell | G06F 1/184 439/157 |
| 5,882,220 | A * | 3/1999 | Horii | G06F 1/1632 361/679.41 |
| 6,124,707 | A * | 9/2000 | Kim | G11B 33/128 324/754.08 |
| 6,179,627 | B1 * | 1/2001 | Daly | H01R 13/6658 439/354 |
| 6,195,259 | B1 | 2/2001 | Whitman et al. | |
| 6,243,270 | B1 * | 6/2001 | Yee | G06F 1/184 361/679.02 |
| 6,625,014 | B1 * | 9/2003 | Tucker | G06F 1/184 312/223.1 |
| 6,811,413 | B2 * | 11/2004 | Keeble | G02B 6/4201 439/374 |
| 6,839,239 | B1 | 1/2005 | Lee | |
| 6,929,403 | B1 | 8/2005 | Arciniegas et al. | |
| 7,035,097 | B2 | 4/2006 | Petrov et al. | |
| 7,257,886 | B2 * | 8/2007 | Haager | H05K 7/1461 29/739 |
| 7,262,958 | B2 * | 8/2007 | Marroquin | G06F 1/187 312/223.2 |
| 7,322,841 | B1 * | 1/2008 | Chuang | H01R 13/62933 361/726 |
| 7,400,936 | B2 * | 7/2008 | Chang | G06F 1/184 361/679.33 |
| 7,551,427 | B1 | 6/2009 | Blaugrund et al. | |
| 8,199,511 | B2 | 6/2012 | Kim et al. | |
| 8,371,861 | B1 * | 2/2013 | Cina | H01R 12/721 257/215 |
| 8,545,234 | B2 * | 10/2013 | Szczesny | G02B 6/428 439/62 |
| 8,582,257 | B2 * | 11/2013 | Love | H02H 3/162 336/65 |
| 8,582,287 | B2 * | 11/2013 | Nguyen | G06F 1/187 211/126.6 |
| 8,644,017 | B2 * | 2/2014 | Dunham | G06F 1/183 361/679.33 |
| 8,851,929 | B2 * | 10/2014 | Sorani | H01R 13/6658 361/695 |
| 9,030,819 | B2 * | 5/2015 | He | G11B 33/124 248/222.51 |
| 9,047,063 | B2 * | 6/2015 | Chang | G06F 1/187 |
| 9,230,606 | B2 * | 1/2016 | Ding | G11B 33/022 |
| 9,627,809 | B2 * | 4/2017 | Gordon | H01R 4/48 |
| 9,653,122 | B1 * | 5/2017 | Chang | G11B 33/124 |
| 9,665,137 | B2 * | 5/2017 | Chi | G06F 1/187 |
| 9,703,332 | B2 * | 7/2017 | Chen | G06F 1/187 |
| 9,717,158 | B2 * | 7/2017 | Della Fiora | H05K 7/1487 |
| 9,755,332 | B1 * | 9/2017 | Ganta | H01R 12/515 |
| 9,966,678 | B2 * | 5/2018 | Chiang | H01R 12/716 |
| 2005/0105265 | A1 * | 5/2005 | Petrov | G11B 33/126 361/679.33 |
| 2006/0121794 | A1 | 6/2006 | Hanley | |
| 2006/0171110 | A1 * | 8/2006 | Li | G06F 1/184 361/679.37 |
| 2006/0250777 | A1 | 11/2006 | Chen | |
| 2007/0086156 | A1 * | 4/2007 | Skinner | G11B 33/022 361/679.31 |
| 2007/0149005 | A1 | 6/2007 | Togami | |
| 2008/0030944 | A1 * | 2/2008 | Lalouette | G11B 33/08 361/679.31 |
| 2008/0244052 | A1 * | 10/2008 | Bradicich | G06F 1/183 709/223 |
| 2011/0289521 | A1 * | 11/2011 | Chen | G11B 33/124 720/601 |
| 2013/0252447 | A1 * | 9/2013 | Mau | G06F 1/187 439/160 |
| 2014/0070682 | A1 | 3/2014 | Dunham | |
| 2015/0362965 | A1 * | 12/2015 | Davis | G06F 1/187 361/679.33 |
| 2015/0382499 | A1 * | 12/2015 | Chiasson | H05K 7/1487 361/679.33 |
| 2017/0168943 | A1 * | 6/2017 | Chou | G06F 12/0833 |

OTHER PUBLICATIONS

Unknown., "M.2 (NGFF) Connectors", Tyco Electronics, 2014, http://www.te.com/commerce/DocumentDelivery/DDEController?Action=srchrtrv&DocNm=1-1773702-1NGFFQRG-EN&DocType=DS&DocLang=EN, 8 pages.

Unknown., "PCIe to M.2 Socket 2 Adapter for PCT Express 3.0 Supports B-Key and Hybrid B/M Key", Teledyne LeCroy, 2014, http://cdn.teledynelecroy.com/files/manuals/pcie_gen3_m.2_socket_2_adapter_quickstart.pdf, 8 pages.

* cited by examiner

NEXT GENERATION FORM FACTOR (NGFF) CARRIER

BACKGROUND

Connectors can be used to connect electronic components (e.g., server components, printed circuit boards, memory modules, etc.) within servers in a computing system or network to one another. Multiple portions (e.g., terminals) of the connector may be connected to an electronic component. The connector can transmit information (e.g., a signal) between the electronic components.

DETAILED DESCRIPTION

A Next Generation Form Factor (NGFF) carrier apparatus can receive an NGFF module. The NGFF carrier can receive a number of types of NGFF modules. For example, an NGFF module associated with a 2260 NGFF configuration can be received by the NGFF carrier. An NGFF module associated with a 2280 NGFF configuration can be received by the NGFF carrier. NGFF modules of different types previously used different carriers. By providing an NGFF carrier with a capability to receive a number of NGFF types, a number of NGFF modules can be received by the same NGFF carrier. A number of NGFF module types being receivable by the same NGFF carrier allows for hot-plugging into an NGFF connector by an NGFF module.

An NGFF connector can include a plurality of upper signal pins and a plurality of upper ground (GND) pins. The GND pins can be longer than other upper pins. The NGFF connector can also include a plurality of lower signal pins and a plurality of lower power (PWR) pins. The PWR pins can be longer than other lower pins. Providing upper GND pins that are longer than other upper pins and lower PWR pins that are longer than other lower pins allows an NGFF module to be removably connected (e.g., hot-plugged) to the NGFF connector without halting the function of the NGFF connector and/or an associated computing device.

An NGFF module is a memory device that incorporates memory and an edge connector (e.g., gold finger). The NGFF module can be coupled to a NGFF connector by inserting the NGFF module into the NGFF connector. Coupling the NGFF module to the NGFF connector can include coupling the edge connector of the NGFF module to a number of lower and/or upper pins that are part of the NGFF connector. Coupling the NGFF module to the NGFF connector can give a computing device access to the memory that is associated with the NGFF module.

As used herein, hot-plugging an NGFF module into the NGFF connector is defined as establishing a connection between the NGFF connector and the NGFF module without interrupting an operation of the NGFF connector and/or the computing device. Establishing a connection between the NGFF connector and the NGFF module includes connecting a plurality of GND pins to the NGFF module before connecting the plurality of PWR pins and the plurality of signal pins to the NGFF module. Establishing the connection between the NGFF connector and the NGFF module includes connecting the plurality of PWR pins to the NGFF module before connecting the plurality of signal pins to the NGFF module.

Figure 1:
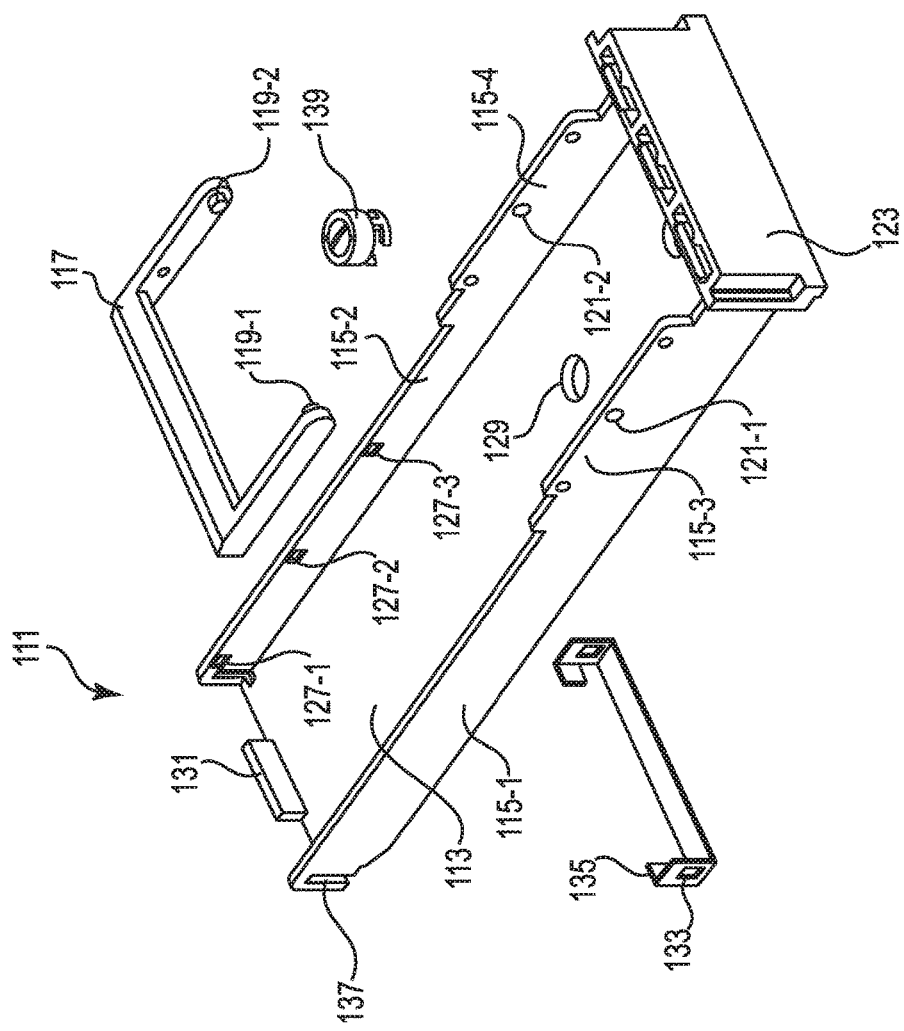
FIG. 1 illustrates an example of an apparatus according to the present disclosure.

FIG. 1 illustrates a diagram of an example of an apparatus according to the present disclosure. The apparatus in FIG. 1 can include an NGFF carrier 111. The NGFF carrier 111, as used herein, includes a flat component 113. The flat component 113 is a rectangular flat piece for receiving an NGFF module on top of. The flat component 113 can be sized and/or shaped in order to be received by an NGFF enclosure carrier (e.g., enclosure carrier described in FIG. 4). That is, the size and/or shape of the NGFF carrier can be determined by a size and/or shape of an enclosure carrier. The NGFF carrier 111 can include a number of components connected to the NGFF carrier 111 (e.g., a bar 117 (shown floating above the NGFF carrier 111 for illustrative purposes), a securing component 133 (shown alongside the NGFF carrier 111 for illustrative purposes), etc.).

Figure 3:
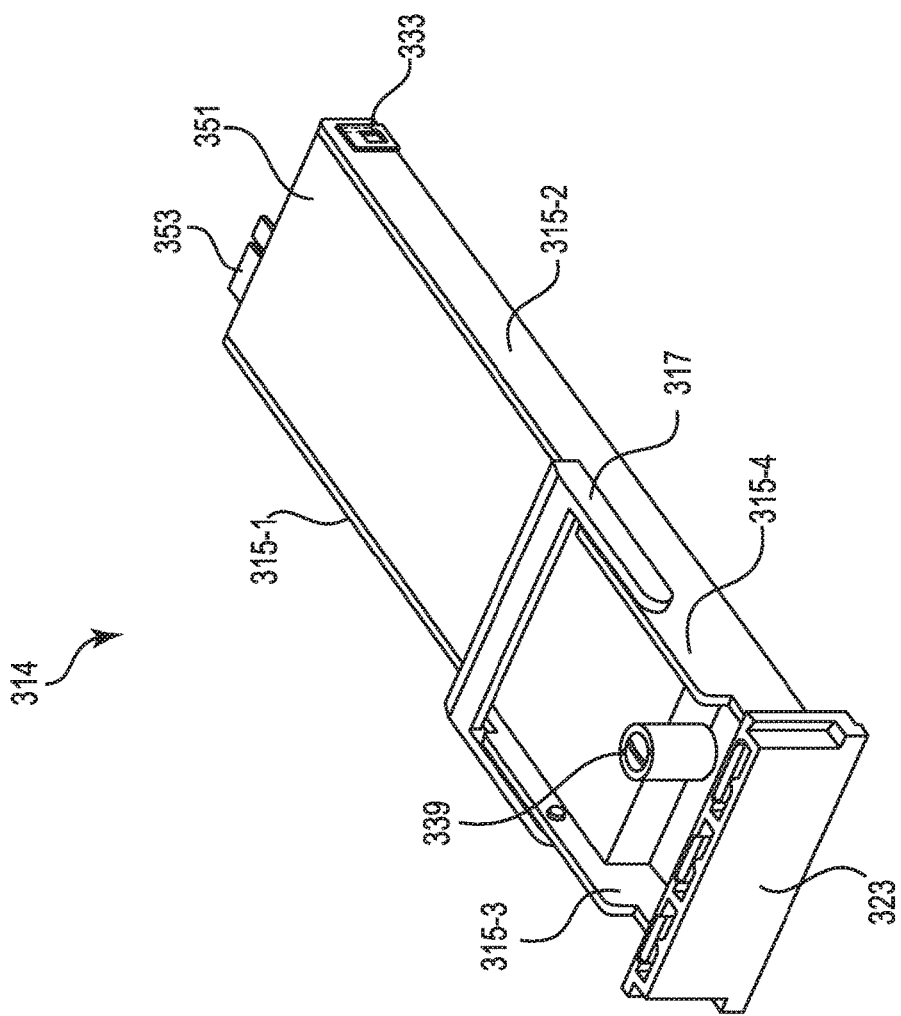
FIG. 3 illustrates an example of an apparatus according to the present disclosure.

The flat component 113 can receive an NGFF module (e.g., NGFF module 351 as illustrated in FIG. 3). The flat component 113 can be perpendicularly connected to flat side components including lower portions 115-1 and 115-2 and higher portions 115-3 and 115-4 (e.g., lower portions are lower in relation to distance from the flat component 113, and higher portions extend higher (longer distance from) the flat component 113). The flat component 113 can be connected to the flat side components to each form an L-shape. That is, the flat component 113 and the lower portions 115-1 and 115-2 and higher portions 115-3 and 115-4 of the flat side components form a U-shaped bay to receive the NGFF module within.

Tabs 127-1, 127-2, and 127-3 along the lower portion 115-2 (and tabs, not pictures, of lower portion 115-1) of the flat side components hold an NGFF module (not shown in FIG. 1) into the NGFF carrier 111. The tabs 127-1, 127-2, and 127-3 can protrude slightly from the lower portion 115-2 to provide a secure hold on the NGFF module once it is secured into place. The NGFF module can be positioned between the tabs 127-1, 127-2, and 127-3 and the flat component 113. To remove the NGFF module, the NGFF module can be lifted away from the flat component 113 and around the tabs 127-1, 127-2, and 127-3 and/or the lower portions 115-1 and 115-2 can be pushed away from each other to bend the flat side components slightly outward to provide a space to lift the NGFF module out of the NGFF carrier 111.

The flat component 113 can include a number of holes 129. The number of holes 129 can be positioned along an interior of the flat component 113. The position of the number of holes 129 can be determined based on a size and/or length of the NGFF module to be received. For example, the longer an NGFF module, the more proximal (e.g., towards the proximal end 123) the hole can be to accommodate a particular length of the NGFF module. The number of holes 129 can receive a fastener 139 to secure a received NGFF module. The fastener 139 can be a screw. The screw can be screwed into threads in a hole of the number of holes 129. The screw can secure an NGFF module to the flat component 113.

The flat component 113 can include a raised portion 131 to connect with a gold finger of the NGFF module. The raised portion 131 can be a number of different lengths, heights, sizes, etc. to accommodate a number of different gold fingers of NGFF modules. For example, an NGFF module with a wider gold finger can use a wider raised portion (e.g., longer longitudinally with respect to the flat component 113) to hold the gold finger in place. An NGFF module with a gold finger of the NGFF module that is further away from the flat component 113 when inserted into the NGFF carrier would use a raised portion that is higher (e.g., extends further up) from the flat component 113 to rest on. The raised portion 131 can have a number of thicknesses depending on how much support of the gold finger is provided. For example, the thicker the raised portion, the more support along the gold finger and the more likely that the gold finger would stay in place and not bend and/or break.

A securing component 133 can include a U-shaped portion and a number of tabs 135. The number of tabs 135 can form an L-shaped portion with the upper portion of the U-shape of the securing component 133. The number of tabs 135 of the securing component 133 can be received by an opening 137 to secure the securing component 133 to the lower portions 115-1 and 115-2 of the flat side components. The tabs 135 can be slid into the opening 137. The tabs 135 of the securing component 133 can secure an NGFF module and/or gold finger of the NGFF module into the NGFF carrier 111. For example, the tabs 135 can prevent the distal end of an NGFF module from sliding out of the NGFF carrier.

Figure 2:
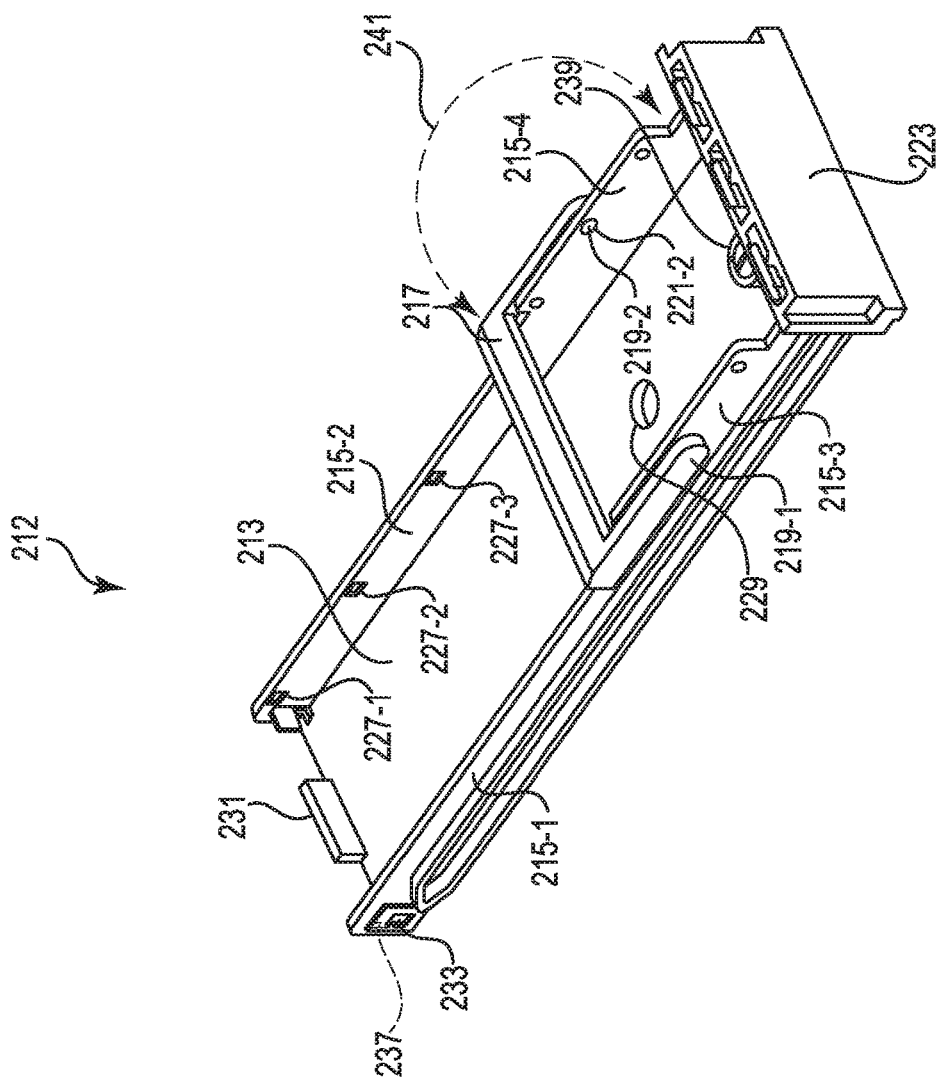
FIG. 2 illustrates an example of an apparatus according to the present disclosure.

The bar 117 can be rotatably connected (as shown in FIG. 2 at 241) to the higher portions 115-3 and 115-4 of the flat side components. The bar 117 can rotate such that the bar can rest on the flat side components toward a proximal end 123 of the NGFF carrier 111, toward a middle of the NGFF carrier 111, or toward a distal end of the NGFF carrier. A first position of the bar 117 can include the bar resting next to the higher portions 115-3 and 115-4 at the proximal end 123 of the NGFF carrier. A second position of the bar 117 can include the bar resting next to the higher portions 115-3 and 115-4 at the distal end of the NGFF carrier.

FIG. 2 illustrates an example of an apparatus according to the present disclosure. FIG. 2 illustrates a bar 217 rotatably connected (illustrated by 241) to higher portions 215-3 and 215-4 of flat side components of an NGFF carrier 212 by insertion of pegs 219-1 and 219-2 into holes 221-1 (not shown) and 221-2. The higher portions 215-3 and 215-4, along with the lower portions 215-1 and 215-2, are connected to a flat component 213. The lower portions 215-1 and 215-2 include a number of tabs 227-1, 227-2 and 227-3. The lower portions 215-1 and 215-2 can be connected to a distal component 233 through an opening 237 in the lower portions 215-1 and 215-2. The flat component can include a number of holes 229 to receive a fastener (e.g., fastener 239).

The higher portion 215-3 and 215-4 can include holes 221-1 and 221-2 to receive a bar 217 by inserting pegs 219-1 and 219-2 into the holes 221-1 and 221-2. The bar 217 can be a flexible bar to flex outside the holes 221-1 (not shown here but shown as 121-1 in FIG. 1) and 221-2 of the higher portions 215-3 and 215-4 when inserting the bar. The bar 217 can return to its non-flexed position once the pegs 219-1 and 219-2 are inside the holes 221-1 (not shown here but shown as 121-1 in FIG. 1) and 221-2 in order to hold the bar 217 in place. The bar 217 can rotate in a half-spherical arc toward the proximal end 223 of the NGFF carrier 211 and rest on a proximal side of the higher portions 215-3 and 215-4 when in a first position. For example, the bar 217 can rotate in a half-spherical arc toward the lower portions 215-1 and 215-2 and rest on a distal side of the higher portions 215-3 and 215-4 when in a second position.

A fastener (e.g., fastener 239 in FIG. 2) can be received in a hole based on a type of the NGFF module received by the NGFF carrier. For example, an NGFF module associated with a 2260 NGFF configuration (e.g., an NGFF connector that is 22 mm long and 60 mm wide) can have a shorter width and therefore receive a fastener in a hole further from the proximal end (e.g., proximal end 223 in FIG. 2) to secure the 2260 NGFF module. In addition, an NGFF module associated with a 2280 (e.g., an NGFF connector that is 22 mm long and 80 mm wide) NGFF configuration can be wider and therefore a fastener in a hole closer to the proximal end (e.g., proximal end 223) can secure the 2280 NGFF module. The number of holes can accommodate a number of NGFF module types based on the size and/or length of the NGFF modules for each type.

FIG. 3 illustrates an example of an apparatus according to the present disclosure. An example apparatus can include an NGFF carrier 314. The NGFF carrier 314 can include a bar 317 rotatably connected (e.g., 241 at FIG. 2) to higher portions 315-3 and 315-4 of flat side components. The bar 317 can be in a first position when inserting an NGFF module 351. The first position can include when the bar 317 is rotated toward a proximal end 323 of the NGFF carrier 314. An NGFF module can be inserted into an NGFF carrier 314 by placing the NGFF module 351 between the higher portions 315-3 and 315-4 and lower portions 315-1 and 315-2 and pushing the NGFF module 351 down past tabs of the lower portions 315-1 and 315-2 (e.g., tabs 227-1, 227-2, and 227-3 in FIG. 2). An inserted NGFF module 351 can be secured in the NGFF carrier by a fastener 339. For example, the fastener 339 can be inserted into a hole (e.g., hole 239 in FIG. 2) to secure the NGFF module 351 into the NGFF carrier 314. A gold finger 353 of the NGFF module 351 can be held in place by a raised portion (e.g., raised portion 131 in FIGS. 1 and 231 in FIG. 2).

Figure 4:
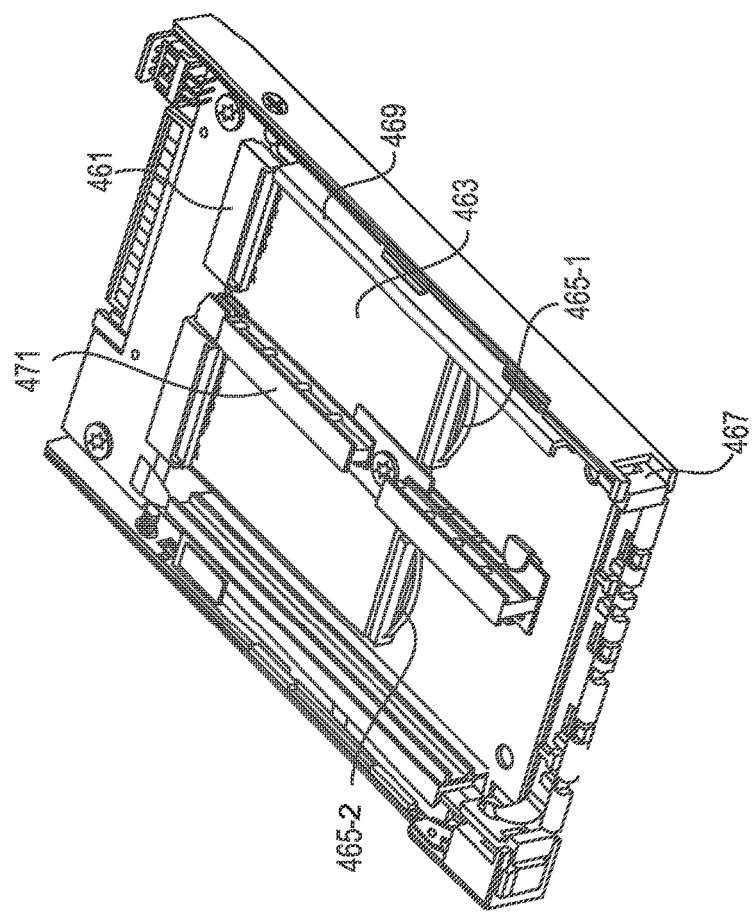
FIG. 4 illustrates an example of an enclosure apparatus according to the present disclosure.

FIG. 4 illustrates an example of an enclosure apparatus according to the present disclosure. An enclosure apparatus can include an enclosure carrier. The enclosure carrier can include a flat surface 463 to receive an NGFF module (e.g., NGFF module 351 in FIG. 3). An NGFF module in an NGFF carrier can be received onto the flat surface 463 of the enclosure carrier. That is, the NGFF carrier in FIGS. 1, 2, and 3 can be flipped upside down from the position/layout illustrated in FIGS. 1, 2, 3 and slid into the enclosure carrier such that a gold finger (e.g., gold finger 353 in FIG. 3) connects into an NGFF connector 461 and an NGFF module (e.g., NGFF module 351 in FIG. 3) is slid onto the flat surface 463 of the enclosure carrier.

The enclosure apparatus can include flat side components 469 and 471 to receive flat side components (e.g., lower portions 215-1 and 215-2 and higher portions 215-3 and 215-4 of side components in FIG. 2) of an NGFF carrier (e.g., NGFF carrier 314 in FIG. 3 if flipped upside down when inserted into the enclosure carrier in FIG. 4). That is, a first lower portion (e.g., lower portion 315-1 in FIG. 3) of the NGFF carrier is slid along a first flat side component (e.g., flat side component 469) and a second lower portion (e.g., lower portion 315-2) is slide along a second flat side component (e.g., flat side component 471).

The NGFF module can be inserted into the enclosure carrier such that a bar (e.g., bar 317) is in contact with a resistance mechanism 465-1 to provide resistance to the NGFF module being inserted. For example, a spring and/or a flexible piece of bent metal can be used to provide pressure and/or resistance back against an inserted NGFF module. For example, the NGFF carrier can be slid into the enclosure carrier such that a bar of the NGFF module comes in contact with the resistance mechanism 465-1 in order to resistively secure the NGFF carrier in place. A second NGFF carrier can be inserted to contact with a resistance mechanism 465-2.

The inserted NGFF module can be locked into place in the enclosure carrier by a corner mechanism 467. The corner mechanism 467 can include a moveable tab and/or locking piece that holds a corner of the NGFF carrier. The corner mechanism 467 can contact with an edge of a distal end (e.g., distal end 323 in FIG. 3) of an NGFF carrier such that the NGFF carrier is locked into position. The corner mechanism can slide out of the way (e.g., by the distal end 323 in FIG. 3 pushing it to slide and/or by a user sliding it out of the way) when the NGFF carrier is inserted into the enclosure carrier. When the NGFF carrier is received by the enclosure carrier (e.g., the bar is pressing against the resistance mechanism), the corner mechanism 467 can slide back into a locked position and hold the edge of the distal end of the NGFF carrier. The corner mechanism 467 holds the NGFF carrier from sliding out of the enclosure carrier. The resistance mechanism 465-1 can provide resistance to the inserted NGFF carrier to allow removal of the NGFF carrier without pulling it out of the enclosure carrier. That is, the resistance mechanism 465-1 provides resistance such that when the corner mechanism 467 is slid out of place allowing the NGFF carrier to slide out of the enclosure carrier, the resistance mechanism 465-1 pushes the NGFF carrier out without pulling the NGFF carrier out.

A gold finger extension (e.g., gold finger 353 in FIG. 3) of an NGFF module held by an NGFF carrier (e.g., NGFF carrier 111 in FIG. 1) can be inserted into an NGFF connector 461. The NGFF module can be coupled to an NGFF connector by inserting the NGFF module into the NGFF connector. Coupling the NGFF module to the NGFF connector can include coupling the edge connector of the NGFF module to a number of lower and/or upper pins that are part of the NGFF connector. Coupling the NGFF module to the NGFF connector can give a computing device access to the memory that is associated with the NGFF module.

The ability of the NGFF carrier to receive a number of sizes, types, and/or configurations of NGFF modules allows for hot-plugging of NGFF modules into NGFF connectors without using a different NGFF carrier for each size, type, and/or configuration of NGFF module. In this way, an NGFF module can be replaced and/or "swapped" out in order to upgrade the computing system using a newer NGFF module inserted into the NGFF carrier and therefore into the computing system.

What is claimed:

1. A Next Generation Form Factor (NGFF) carrier comprising:
    a frame comprising a flat component perpendicularly connected to two flat side components that each comprise a higher portion raised higher than a lower portion in relation to the flat component, the frame being to receive an NGFF module between the two flat side components;
    the bar rotatably connected to the higher portions of the two flat side components such that the bar is rotatable between a first position in which it is located on a first side of the higher portions and a second position in which it is located on a second side of the higher portions, wherein the NGFF module is insertable in the frame when the bar is rotated to the first position and wherein the bar rests against the lower portions of the two flat side components in the first position and the second position; and
    a number of holes along an interior of the flat component to receive a fastener that is to secure the NGFF module in the frame.

2. The NGFF carrier of claim 1, wherein the number of holes are located such that a first type of NGFF module can be secured to the frame by inserting the fastener in a first one of the holes and a second type of NGFF module can be secured to the frame by inserting the fastener in a second one of the holes.

3. The NGFF carrier of claim 1, further comprising a number of tabs protruding out from each of the two flat side components the tabs being configured to secure the NGFF module to the frame.

4. An Next Generation Form Factor (NGFF) carrier, comprising:
    a frame comprising a flat component, two flat side components perpendicularly connected to the flat component, and first tabs protruding from the two flat side components, each of the flat side components comprising a higher portion raised higher than a lower portion in relation to the flat component, the frame being to receive an NGFF module between the two flat side components;
    a bar rotatably connected to the higher portions of the two flat side components such that the bar is rotatable between a first position in which it is located on a first side of the higher portions and a second position in which it is located on a second side of the higher portions, wherein the NGFF module is insertable in the frame when the bar is rotated to the first position and wherein the bar rests against the lower portions of the two flat side components in the first position and the second position; and
    a number of holes along an interior of the flat component to receive a fastener that is to secure the NGFF module in the frame;
    an end component perpendicularly attached to the flat component at a first end of the frame, the end component being configured to contact and support the NGFF module when the NGFF module is inserted into the frame,
    second tabs connected to the first end of the frame and configured to prevent the NGFF module from sliding out the first end of the frame when the NGFF module is inserted into the frame.

5. The NGFF carrier of claim 4, wherein the end component is to contact and support a gold finger extension of the NGFF module when the NGFF module is inserted into the frame.

6. The NGFF carrier of claim 4, wherein the fastener is a screw that screws into threads in the holes on the flat component.

7. An Next Generation Form Factor (NGFF) system, comprising:
    an NGFF carrier, comprising:
        a frame comprising a flat component, two flat side components perpendicularly connected to the flat component, and tabs protruding from the two flat side components, each of the flat side components comprising a higher portion raised higher than a lower portion in relation to the flat component, the frame being to receive an NGFF module between the two flat side components;
        a bar rotatably connected to the higher portions of the two flat side components such that the bar is rotatable between a first position in which it is located on a first side of the higher portions and a second position in which it is located on a second side of the higher portions, wherein the NGFF module is insertable in the frame when the bar is rotated to the first position and wherein the enclosure carrier includes a spring mechanism that is to apply a force to the bar of the NGFF carrier in a direction opposite that in which the NGFF carrier slides as it is installed in the enclosure carrier; and a number of holes along an interior of the flat component to receive a fastener that is to secure the NGFF module in the frame;

an enclosure carrier in which the NGFF carrier is to be installed comprising an opening at a proximal end through which the NGFF carrier slides as it is installed in the enclosure carrier and an NGFF connector at a distal end to receive a golden finger of the NGFF module when the NGFF module is installed in the enclosure carrier.

8. The NGFF system of claim 7, wherein the proximal end of the enclosure carrier comprises a latch to secure a corner of the NGFF module in the enclosure carrier.

9. The NGFF system of claim 7, wherein the proximal end comprises a latch that holds the NGFF module into the enclosure carrier by providing tension against the mechanism of the enclosure carrier.

10. The NGFF system of claim 7, wherein the fastener is received by a first hole of the number of holes when the NGFF module is a 2260 NGFF module and a second hole of the number of holes when the NGFF module is a 2280 NGFF module.

* * * * *